United States Patent

Wu et al.

[11] Patent Number: 6,080,674
[45] Date of Patent: Jun. 27, 2000

[54] METHOD FOR FORMING VIA HOLES

[75] Inventors: Hua-Shu Wu; Chun-Hung Peng, both of Hsinchu, Taiwan

[73] Assignee: United Microelectronics Corp., Taiwan

[21] Appl. No.: 09/226,029

[22] Filed: Jan. 6, 1999

[30] Foreign Application Priority Data

Aug. 31, 1998 [TW] Taiwan ................................. 87114426

[51] Int. Cl.⁷ ................................................. H01L 21/302
[52] U.S. Cl. .......................... 438/692; 438/697; 438/708; 438/723; 438/724; 438/704; 438/725; 438/700
[58] Field of Search ..................... 438/692, 697, 438/708, 717, 725, 724, 720, 756, 723, 625, 704, 700

[56] References Cited

U.S. PATENT DOCUMENTS

| 5,158,898 | 10/1992 | Hayden et al. | 438/158 |
| 5,235,189 | 8/1993 | Hayden et al. | 257/329 |
| 5,312,512 | 5/1994 | Allman et al. | 438/692 |
| 5,378,318 | 1/1995 | Weling et al. | 438/697 |
| 5,532,516 | 7/1996 | Pasch et al. | 257/752 |
| 5,663,108 | 9/1997 | Lin | 438/624 |
| 5,710,061 | 1/1998 | Cleeves | 438/618 |
| 5,798,559 | 8/1998 | Bothra et al. | 257/522 |

*Primary Examiner*—Benjamin L. Utech
*Assistant Examiner*—Binh X. Tran
*Attorney, Agent, or Firm*—Madson & Metcalf

[57] ABSTRACT

A method for forming a plurality of self-aligned via holes applied to a semiconductor device is disclosed. The method includes steps of (a) providing a substrate forming thereon a conducting layer forming thereon a sacrificial layer; (b) partially removing the sacrificial layer while retaining a plurality of sacrificial via pillars, and removing portions of the conducting layer under the removed sacrificial layer; (c) forming a first insulating layer between the plurality of the sacrificial via pillars, and then planarizing the first insulating layer to expose tops of the plurality of sacrificial via pillars; and (d) removing the plurality of the sacrificial via pillars while retaining the first insulating layer to form the plurality of the self-aligned via holes. By the above-described method, the formed via holes are self-aligned to the underlying metal lines and pads and less photolithography equipment requirement is needed to define fine via holes.

17 Claims, 5 Drawing Sheets

Fig. 3 (b-1)

METHOD FOR FORMING VIA HOLES

FIELD OF THE INVENTION

The present invention is related to a method for forming a via hole, and more especially to a method for forming a self-aligned via hole.

BACKGROUND OF THE INVENTION

Recently, the large-scale integrated circuits commonly utilize multilevel metallization schemes involving two or more patterned conductive layers, wherein each of the conductive layers is separated by insulating layers. Certainly, in order to connect two different conductive layers, a plurality of via holes need to be formed therebetween so that the conductive layers can be connected by using vertically extending via structures. In the process for forming via holes, an insulating layer is often formed on the first conductive layer before another conductive layer is formed. Thereafter, the via holes are defined and formed by a photolithography and etching process. At the early stage, a general method for forming a plurality of via holes was mainly accomplished by conventional photolithographic processes. However, there are some problems encountered with conventional photolithographic processes. The actual positions of the via holes are often shifted from the predetermined positions of the via holes because the mask is not easily aligned during the photolithographic process. Therefore, a portion of the conductive layer which should not be exposed is exposed after etching process, resulting in the occurrence of a short circuit between the exposed conductive layer and the subsequently formed contact plug. This brings about a low yield rate. Certainly, the misaligned phenomenon will be worsen in the minimized semiconductor process.

In order to prevent the misaligned phenomenon, a so-called self-aligned via hole process is used to overcome this defect at the present day. In other words, it is uneasy to align the mask and the cost for the correct alignment is relatively expensive. Moreover, in order to obtain higher interconnection packing densities, a fine high-aspect-ratio via is necessary. Much effort has been dedicated to the development of advanced steppers and etchers to achieve this goal. Besides, misalignment of photolithography step would dump lots of difficulties in etching process. Hence, one method is provided for forming self-aligned via holes to improve the defects encountered by the prior art. This is why self-aligned via is crucial for advanced interconnection.

Some self-aligned contact processes have been proposed. Please refer to FIG. 1 showing a method for forming a self-aligned plug. As shown in FIG. 1(a), a conductive layer 62 is formed on the substrate 61. Thereafter, a plug 621 is formed on the conductive layer 62 by a first step of photolithography and etching process, as shown in FIG. 1(b). As shown in FIG. 1(c), the conductive layer 62 are partially removed to define a required circuit by a second photolithography and etching process. Finally, the insulating layer 65 is formed on the conductive layer 62 and then planarized to expose the top of the self-aligned plug 621 as shown in FIG. 1(d). However, the above-described process has some defects:

1. The step of forming a metal layer results in an increased manufacturing cost.
2. The plurality of plugs formed previously cause a rugged surface so that the second photolithography and etching process is very hard to be executed and controlled.

Another method of providing a via structure has been disclosed. The method is to create metal pillars before a dielectric layer is deposited over a metal line and then to expose the tops of metal pillars by a proper planarization process. However, the prior methods do not provide a simple and reliable (good controllability) approach to produce via structure.

SUMMARY OF THE INVENTION

An object of the present invention is to provide a method for forming a plurality of self-aligned via holes applied to a semiconductor device to reduce the manufacturing cost and control the process easier. The method includes steps of (a) providing a substrate forming thereon a conducting layer forming thereon a sacrificial layer, (b) partially removing the sacrificial layer while retaining a plurality of sacrificial via pillars, and removing portions of the conducting layer under the removed sacrificial layer, (c) forming a first insulating layer between the plurality of the sacrificial via pillars, and then planarizing the first insulating layer to expose tops of the plurality of sacrificial via pillars, and (d) removing the plurality of the sacrificial via pillars while retaining the first insulating layer to form the plurality of self-aligned via holes.

In accordance with one aspect of the present invention, the conducting layer is a metal layer formed over the substrate by a metal sputtering technique.

In accordance with another aspect of the present invention, the step (a) further includes a step of forming an etch-stop layer between the conducting layer and the sacrificial layer for preventing the conducting layer from being over-etched.

In accordance with another aspect of the present invention, the etch-stop layer is a silicon rich oxide (SRD) layer.

In accordance with another aspect of the present invention, the step (b) further includes a step of removing portions of the etch-stop layer under the removed sacrificial layer.

In accordance with another aspect of the present invention, the step (d) further includes a step of removing other portions of the etch-stop layer to expose other portions of conducting layer.

In accordance with another aspect of the present invention, in the step (d), the insulating layer has a removal rate smaller than that of the sacrificial layer.

In accordance with another aspect of the present invention, the sacrificial layer is a spin-on glass (SOG) layer.

In accordance with another aspect of the present invention, the sacrificial layer is a polyimide (PI) layer.

In accordance with another aspect of the present invention, the sacrificial layer is a silicon nitride layer.

In accordance with another aspect of the present invention, the step (b) is executed by a photolithography and etching technique.

In accordance with another aspect of the present invention, the step (b) further includes a step of partially removing retained portions of the sacrificial layer for defining the plurality of sacrificial via pillars.

In accordance with another aspect of the present invention, the first insulating layer is a dielectric layer.

In accordance with another aspect of the present invention, the dielectric layer is a silicon dioxide ($SiO_2$) layer.

In accordance with another aspect of the present invention, the step (d) is executed by a selective photolithography and etching technique for removing the plurality of sacrificial via pillars.

In accordance with another aspect of the present invention, after the step (b), the method further includes a step of (b1) forming a second insulating layer between the sacrificial via pillars and other portions of the conducting layer, and then planarizing the second insulating layer to expose tops of the plurality of sacrificial via pillars.

In accordance with another aspect of the present invention, after step (b1), the method further includes a step of (b2) removing portions of the second insulating layer and partially removing retained portions of the sacrificial layers for defining the plurality of sacrificial via pillars.

In accordance with another aspect of the present invention, the step of planarizing the first and second insulating layers are executed by one of a spin-on glass (SOG) technique and a chemical mechanical polishing (CMP) technique.

The present invention may best be understood through the following description with reference to the accompanying drawings, in which:

DETAILED DESCRIPTION OF THE PREFERRED EMBODIMENTS

Please refer to FIG. 2 showing the first preferred embodiment of the present invention. Firstly, as shown in FIG. 2(a), a conductive layer 12 (i.e. a metal layer) is formed on a substrate 11 by a metal sputtering technique. Thereafter, an etch-stop layer 13 is formed on the conductive layer 12 by chemical vapor deposition. Preferably, the etch-stop layer 13 is a silicon rich oxide (SRD) layer. A sacrificial layer 14 is then formed on the etch-stop layer 13. Preferably, the sacrificial layer 14 can be a spin-on glass (SOG) layer, a polyimide (PI) layer, or a silicon nitride layer. However, the step of forming the etch-stop layer 13 between the conductive layer 12 and the sacrificial layer 14 may be not necessary, depending on the manufacturing process. The purpose of forming an etch-stop layer 13 between the conducting layer 12 and the sacrificial layer 13 is to prevent the conducting layer 12 from being over-etched.

Figure 1A:
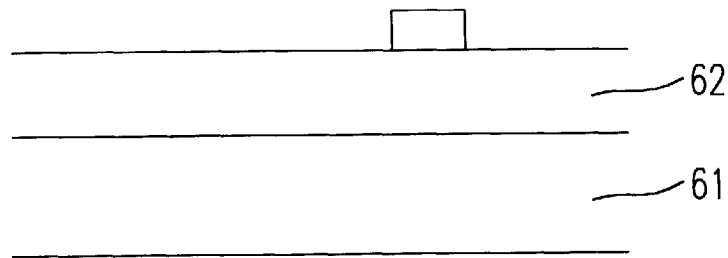
FIGS. 1a–1d are schematic diagram showing a general method for forming a self-aligned plug.
Figure 1B:
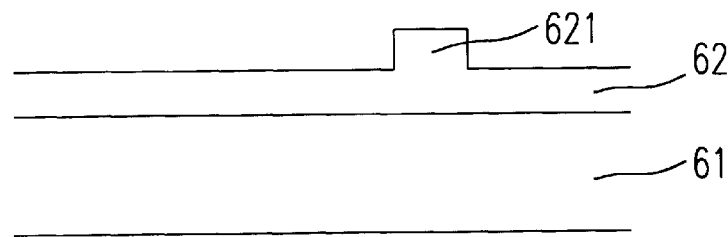
Figure 1C:
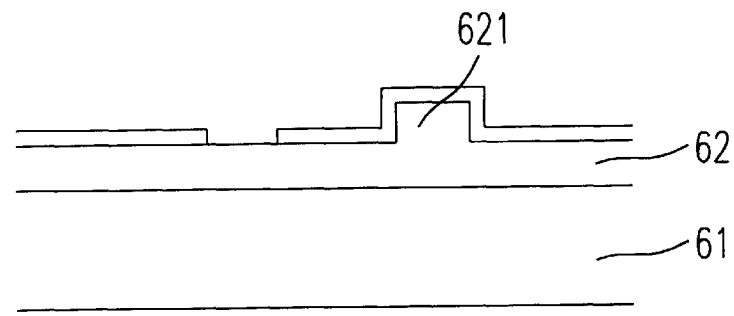
Figure 1D:
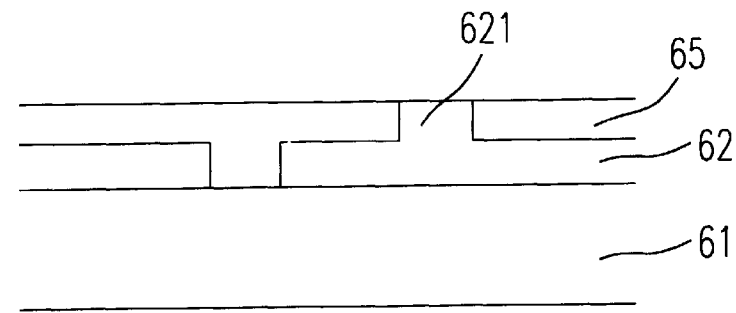
Figure 2A:
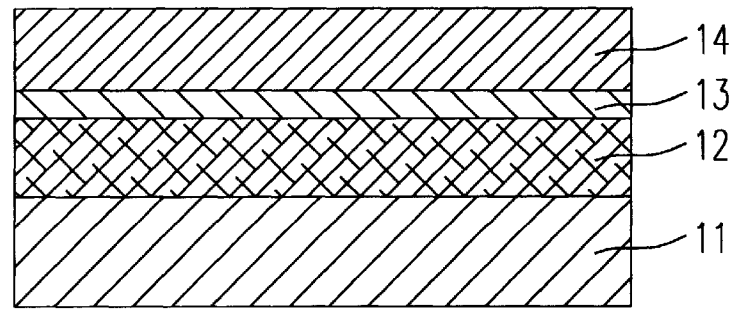
FIGS. 2a–2f are schematic diagram showing the first preferred embodiment of the present invention.
Figure 2B:
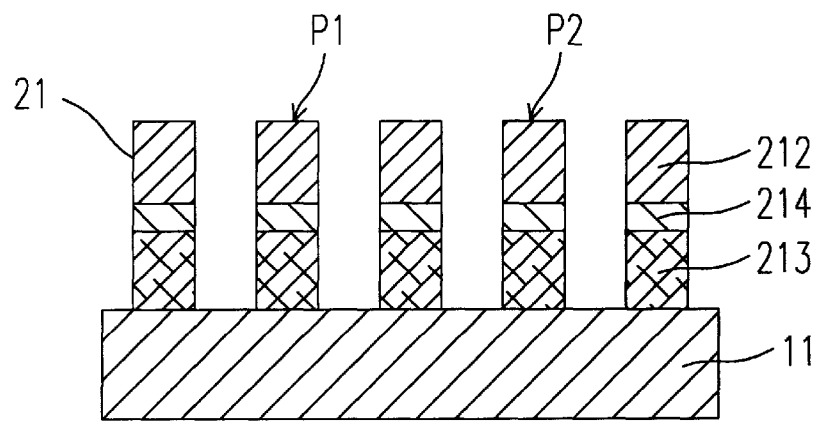
Figure 2C:
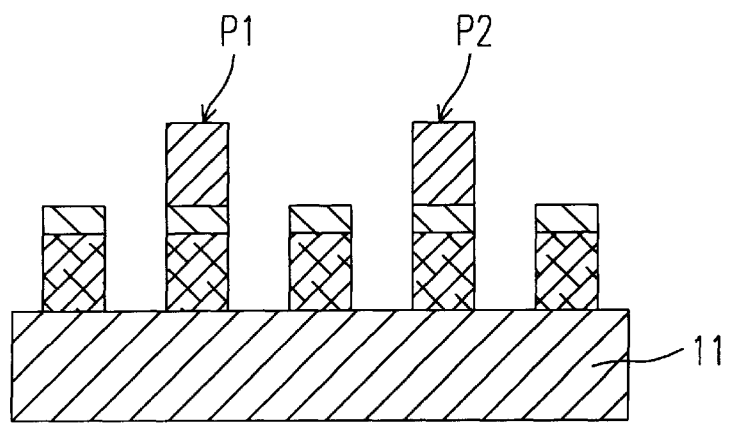

Secondly, as shown in FIG. 2(b), the sacrificial layer 14, the etch-stop layer 13, and the conducting layer 12 are partially removed by a first step of photolithography and etching process while retaining a plurality of sacrificial via pillars 21. Thereafter, the sacrificial layers 212 under the retained sacrificial via pillars 21 are partially removed by a second step of the photolithography and etching process, as shown in FIG. 2(c), to define a plurality of sacrificial via pillars 21 (such as P1 and P2) corresponding to a plurality of via holes which is predetermined to be formed. By the step of forming the sacrificial via pillars, less photolithography equipment requirement (overlay/resolution performance) is needed to define fine via holes. It can decrease a lot of manufacturing costs in the second step of photolithography and etching process.

Figure 2D:
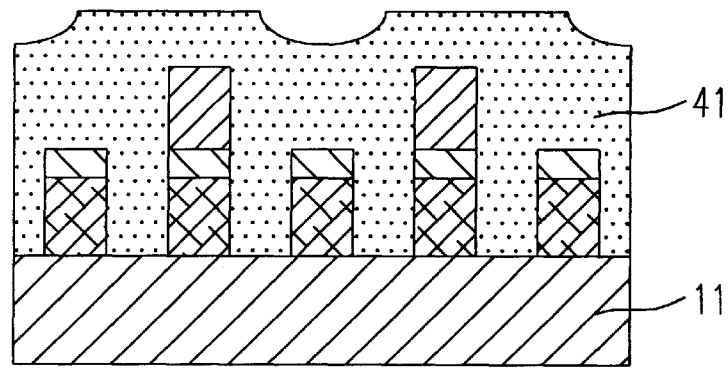
Figure 2E:
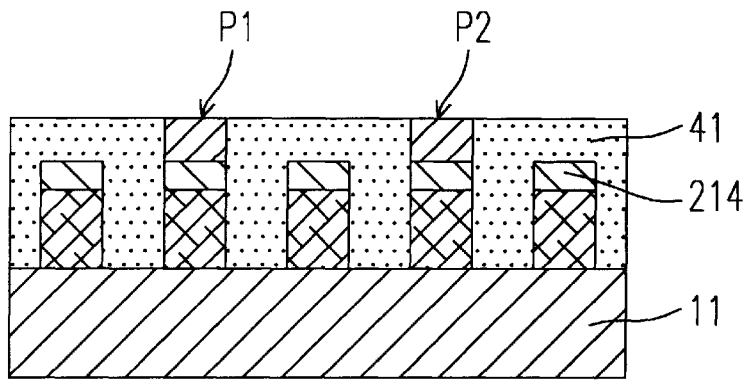

In the step (c), as shown in FIG. 2(d), a first insulating layer 41 is formed between the plurality of sacrificial via pillars 21. The first insulating layer 41 is a dielectric layer. Preferably, the dielectric layer is a silicon dioxide ($SiO_2$) layer. Thereafter, the first insulating layer 41 is planarized to expose tops P11 and P21 of the plurality of sacrificial via pillars by a spin-on glass (SOG) technique or a chemical mechanical polishing (CMP) technique, as shown in FIG. 2(e).

Figure 2F:
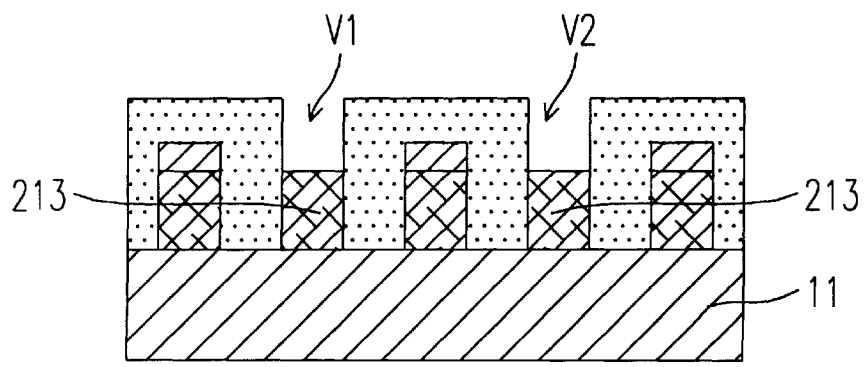
Figure 3A:
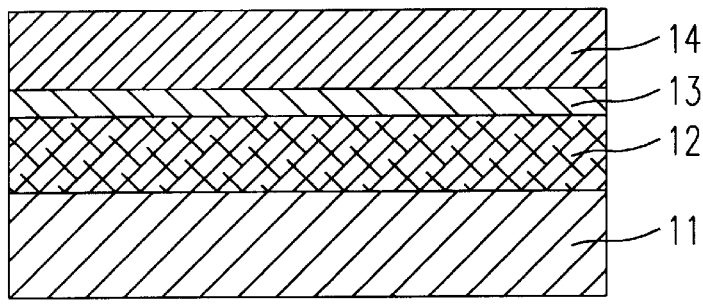
FIGS. 3a–3f are schematic diagram showing the second preferred embodiment of the present invention.
Figure 3B:
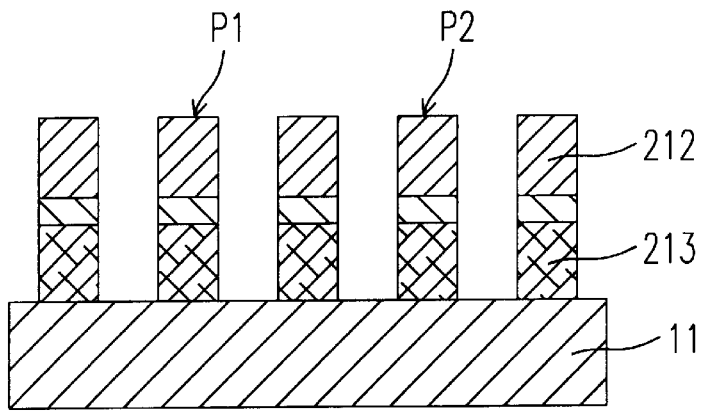
Figure 3C:
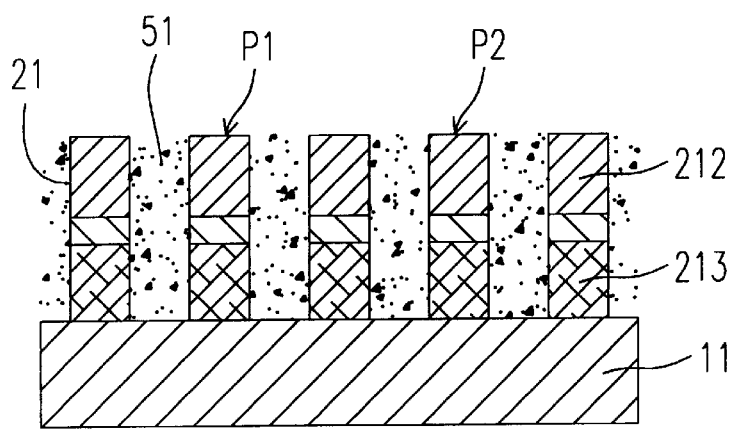
Figure 3C:
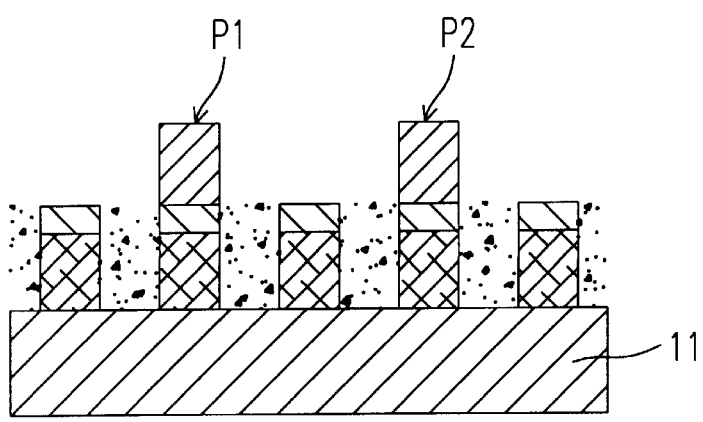
Figure 3D:
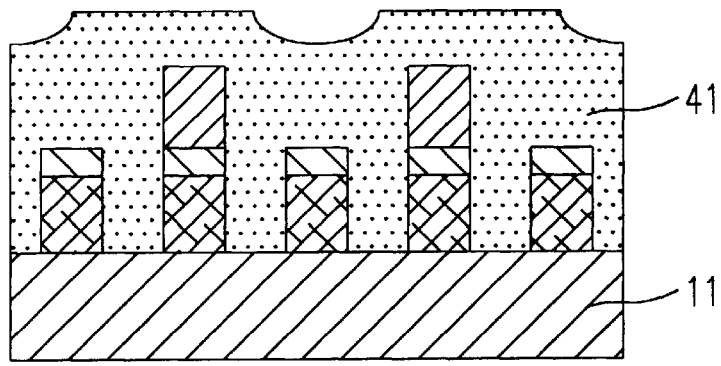
Figure 3E:
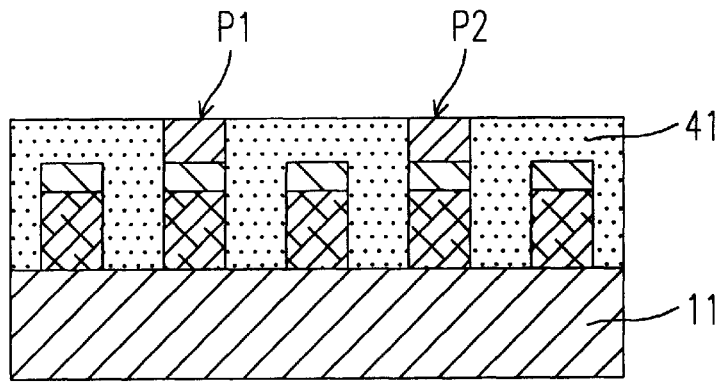
Figure 3F:
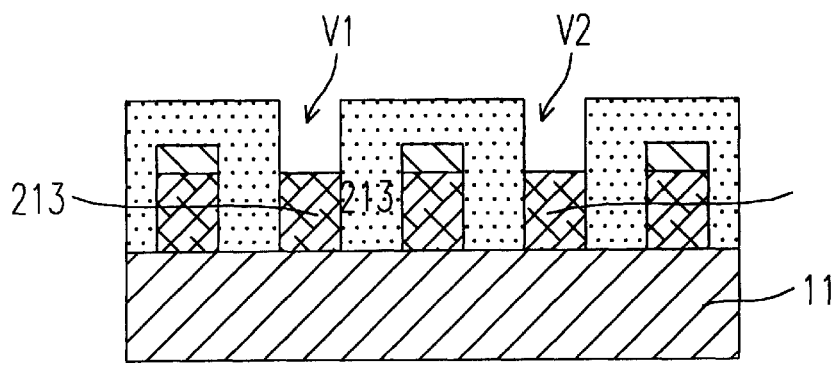

Please refer to FIG. 2(f). In the step (d), the sacrificial via pillars 21 are removed while retaining the first insulating layer 41 to form the plurality of self-aligned via holes (such as V1 and V2) by a selective photolithography and etching technique. Certainly, the etch-stop layers 214 under the sacrificial via pillars 21 are also removed to expose other portions of the conducting layers 213. However, because the step of removing the plurality of sacrificial via pillars 21 is executed by a selective photolithography and etching technique, the material of the sacrificial layer 14 must be different from that of the insulating layer 41. Namely, in order to remove the sacrificial via pillars, the insulating layer must have a removal rate smaller than that of the sacrificial layer corresponding to a photolithography and etching technology. If the insulating layer is an oxide layer, the sacrificial layer may be a spin-on glass (SOG) layer, a polyimide (PI) layer, or a silicon nitride layer, even a metal layer. To sum up, the material of the sacrificial layer depends on that of the insulating layer.

Please refer to FIG. 3 showing the second preferred embodiment of the present invention. The method of the second preferred embodiment is similar to that of the first preferred embodiment. The difference between the two preferred embodiments is in the step (b), as shown in FIG. 3(b-1). The method of the second preferred embodiment further includes a step of forming a second insulating layer 51 between the sacrificial via pillars 21, and then planarizing the second insulating layer 51 to expose tops of the plurality of sacrificial via pillars. Thereafter, the following steps are the same as those of the first preferred embodiment. Forming a second insulating layer between the sacrificial via pillars is of great advantage to photolithography and etching process. Certainly, the step of planarizing the second insulating layers is executed by a spin-on glass (SOG) technique or a chemical mechanical polishing technique (CMP).

In accordance with the above-described method, the method has some advantages as follows:

1. The formed via holes are self-aligned to the underlying metal lines and pads.
2. Less photolithography equipment requirement (overlay/resolution performance) is needed to define fine via holes.
3. The via holes could be easily formed by using the present scheme without needing any complex via etching procedure.
4. The slope of via side walls could be controlled by controlling the profile of the sacrificial layer.
5. An etch-stop layer or a 2-step planarization process is optional to prevent the conducting layer from being over-etched.

The above embodiments can be modified by any skillful person in the art without departing the spirit and scope of the accompanying claims.

What is claimed is:

1. A method for forming a plurality of self-aligned via holes applied to a semiconductor device comprising steps of:
   (a) providing a substrate forming thereon a conducting layer forming thereon a sacrificial layer;

(b) partially removing said sacrificial layer and said conducting layer while retaining a plurality of sacrificial via pillars, wherein each of said sacrificial via pillars has a remaining conducting layer and a remaining sacrificial layer;

(c) partially removing said remaining sacrificial layer on said plurality of sacrificial via pillars;

(d) forming a first insulating layer between said plurality of said sacrificial via pillars, and then planarizing said first insulating layer to expose top surfaces of said plurality of sacrificial via pillars; and (e) removing said plurality of said sacrificial via pillars while retaining said first insulating layer to form said plurality of self-aligned via holes.

2. The method according to claim 1 wherein in said step (a), said conducting layer is a metal layer formed over said substrate by a metal sputtering technique.

3. The method according to claim 1 wherein said step (b) is executed by a photolithography and etching technique.

4. The method according to claim 1 wherein said step (d) is executed by a selective photolithography and etching technique for removing said plurality of sacrificial via pillars.

5. The method according to claim 1 wherein said first insulating layer is a dielectric layer.

6. The method according to claim 5 wherein said dielectric layer is a silicon dioxide ($SiO_2$) layer.

7. The method according to claim 1 wherein after said step (b), said method further includes a step of (b1) forming a second insulating layer between said sacrificial via pillars and then planarizing said second insulating layer to expose top surfaces of said plurality of sacrificial via pillars.

8. The method according to claim 7 wherein step (c) further includes a step of removing a top portion of said second insulating layer to expose top portions of said sacrificial via pillars.

9. The method according to claim 7 wherein said step of planarizing said first and second insulating layers are executed by one of a spin-on glass (SOG) technique and a chemical mechanical polishing (CMP) technique.

10. The method according to claim 1 wherein in said step (d), said insulating layer has a removal rate smaller than that of said sacrificial layer.

11. The method according to claim 10 wherein said sacrificial layer is a spin-on glass (SOG) layer.

12. The method according to claim 10 wherein said sacrificial layer is a polyimide (PI) layer.

13. The method according to claim 10 wherein said sacrificial layer is a silicon nitride layer.

14. The method according to claim 1 wherein said step (a) further includes a step of forming an etch-stop layer between said conducting layer and said sacrificial layer for preventing said conducting layer from being over-etched.

15. The method according to claim 14 wherein said etch-stop layer is a silicon rich oxide (SRD) layer.

16. The method according to claim 14 wherein said step (b) further includes a step of removing portions of said etch-stop layer under said removed sacrificial layer.

17. The method according to claim 16 wherein said step (d) further includes a step of removing other portions of said etch-stop layer to expose other portions of said conducting layer.

* * * * *